United States Patent
Uemura et al.

(10) Patent No.: US 9,570,326 B2
(45) Date of Patent: Feb. 14, 2017

(54) SUBSTRATE CLEANING METHOD, SUBSTRATE CLEANING APPARATUS, AND COMPUTER-READABLE STORAGE MEDIUM

(71) Applicant: TOKYO ELECTRON LIMITED, Tokyo (JP)

(72) Inventors: Ryoichi Uemura, Koshi (JP); Yasushi Takiguchi, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 106 days.

(21) Appl. No.: 14/570,151

(22) Filed: Dec. 15, 2014

(65) Prior Publication Data

US 2015/0194301 A1  Jul. 9, 2015

(30) Foreign Application Priority Data

Jan. 9, 2014  (JP) .................. 2014-002413

(51) Int. Cl.
  *B08B 7/00*  (2006.01)
  *H01L 21/67*  (2006.01)
  *G03F 7/42*  (2006.01)

(52) U.S. Cl.
  CPC ......... *H01L 21/67051* (2013.01); *G03F 7/422* (2013.01)

(58) Field of Classification Search
  CPC ............. H01L 21/67051; H01L 21/205; H01L 21/67028; B08B 3/08; B08B 3/08004
  USPC ....................... 134/2, 4, 18, 26, 30
  See application file for complete search history.

(56) References Cited

U.S. PATENT DOCUMENTS

| | | | |
|---|---|---|---|
| 2006/0048792 A1 | 3/2006 | Nakamura et al. | |
| 2009/0250079 A1* | 10/2009 | Yoshihara | B08B 3/024 134/4 |
| 2010/0313915 A1* | 12/2010 | Fujiwara | H01L 21/67051 134/33 |

FOREIGN PATENT DOCUMENTS

JP   2006-080315 A1   3/2006

* cited by examiner

*Primary Examiner* — Duy Deo
*Assistant Examiner* — Maki Angadi
(74) *Attorney, Agent, or Firm* — Burr & Brown, PLLC

(57) ABSTRACT

A substrate cleaning method includes: a first step in which a cleaning liquid is ejected from a nozzle N2 to a central portion of a wafer W; a second step in which a dry gas is ejected from a nozzle N3 to the central portion of the wafer W to form a dry area; a third step in which the cleaning liquid is ejected from the nozzle N2 while the nozzle N2 is moved from a central side of the wafer W to a peripheral side thereof; a fourth step in which a width of an intermediate area generated between a wet area and the dry area is acquired; and a fifth step in which, when the width of the intermediate area exceeds a predetermined threshold value, a process parameter is changed such that the width of the intermediate area becomes the threshold value or less.

6 Claims, 8 Drawing Sheets

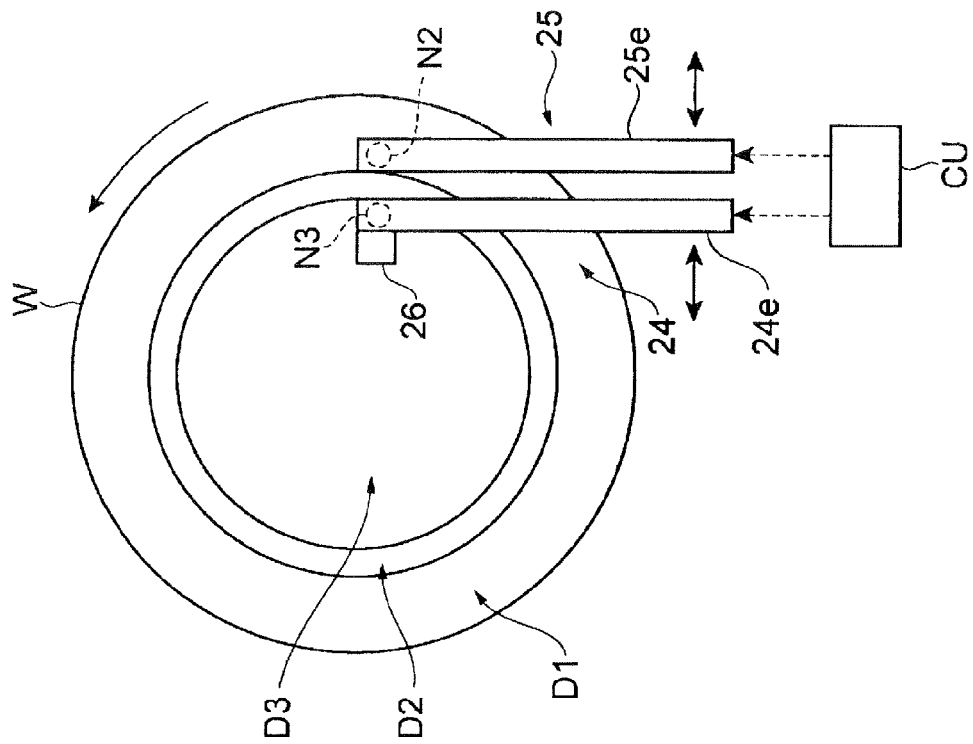
F I G. 5A
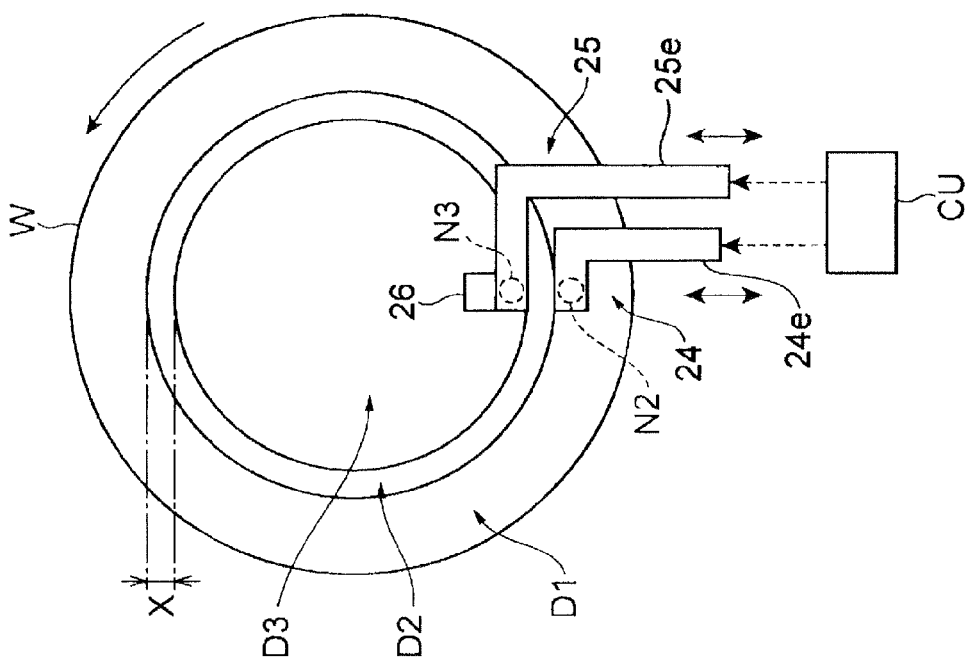
F I G. 5B

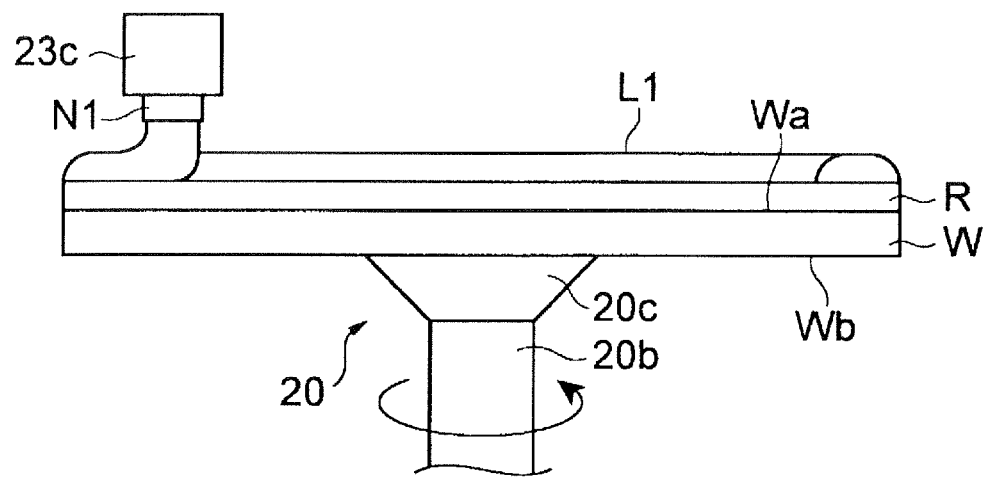
F I G. 6A
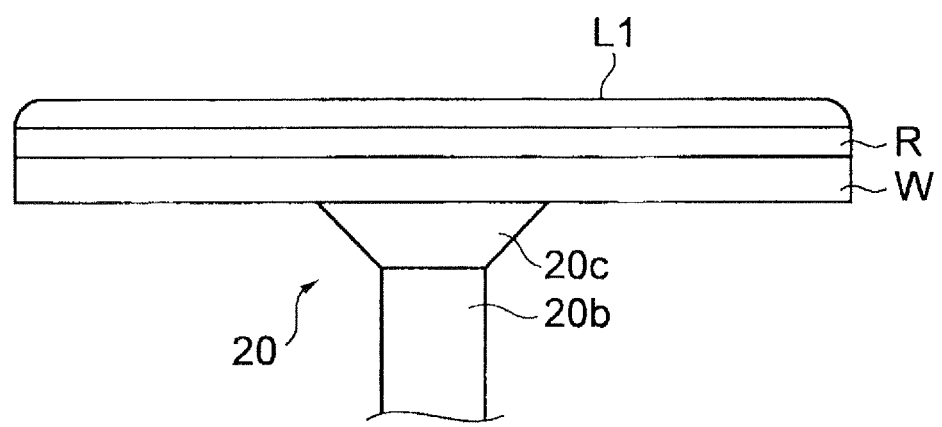
F I G. 6B

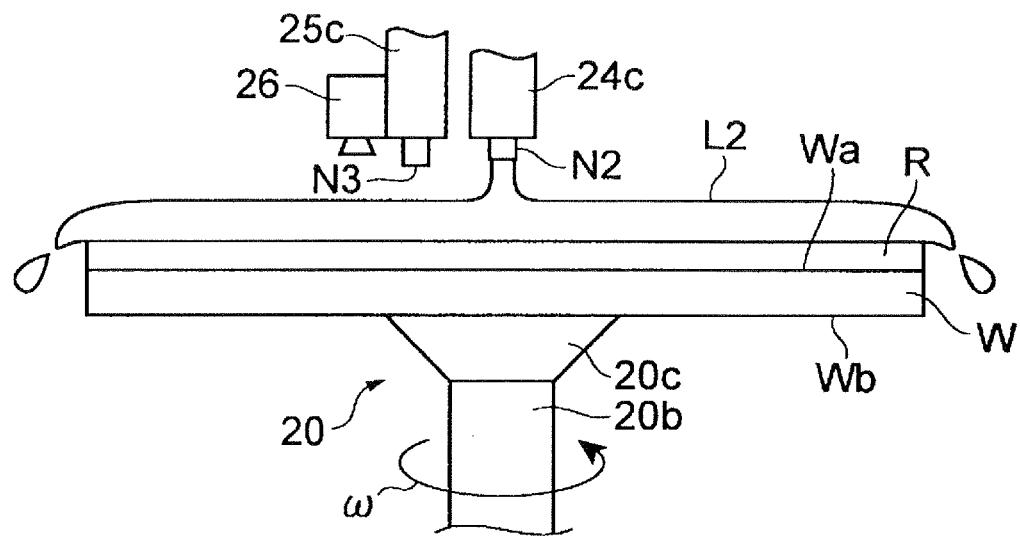
F I G. 7A
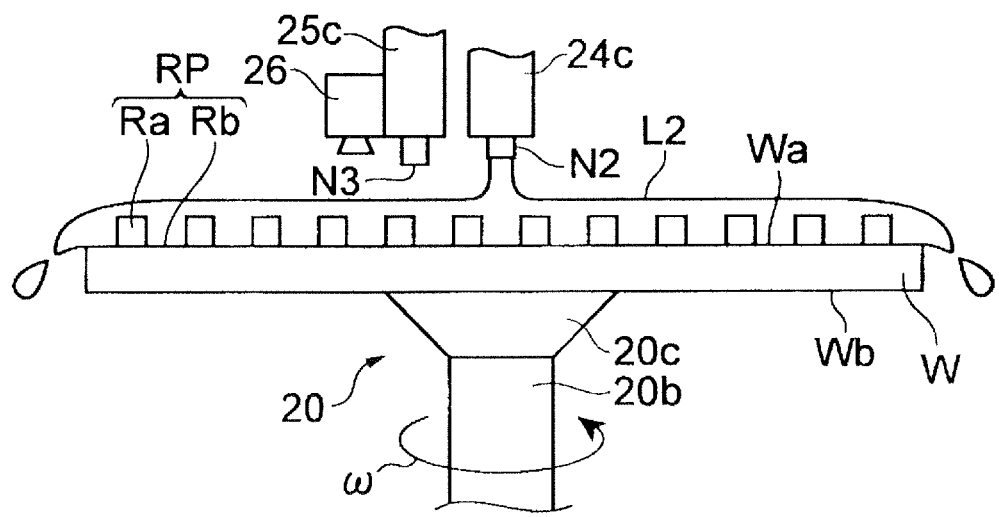
F I G. 7B

SUBSTRATE CLEANING METHOD, SUBSTRATE CLEANING APPARATUS, AND COMPUTER-READABLE STORAGE MEDIUM

CROSS REFERENCE TO RELATED APPLICATIONS

This application is based upon and claims the benefit of priority from the prior Japanese Patent Application No. 2014-002413 filed on Jan. 9, 2014 the entire contents of which are incorporated herein by reference.

FIELD OF THE INVENTION

The present invention relates to a substrate cleaning method, a substrate cleaning apparatus, and a computer-readable storage medium.

BACKGROUND ART

In a recent a micro-process, an irregular pattern (e.g., resist pattern) is generally formed on a substrate (e.g., semiconductor wafer) by means of a photolithographic technique. Specifically, the irregular pattern is formed by a coating step for coating a substrate with a resist material to form a resist film, an exposure step for exposing the resist film, and a developing step for developing the exposed resist film.

The developing step includes a cleaning process in which a substance of a dissolved resist (dissolved resist substance), which has been dissolved by a developer, is removed together with the developer from a surface of the substrate. In the cleaning process, if the resist dissolved substance is not completely removed to remain on the substrate, a desired irregular pattern may not be obtained, resulting in defective development.

Thus, in order to restrain the defective development, a substrate cleaning method described in JP2006-080315A includes: a step in which a cleaning liquid is supplied to a central portion of a rotating substrate so that the cleaning liquid spreads all over a surface of the substrate; a step in which, during the rotation of the substrate, a cleaning-liquid supply position on the surface of the substrate is moved from a central side of the substrate toward a peripheral side thereof by a predetermined distance, and a dry gas is ejected to the central portion of the substrate to form a dry area; and a step in which, during the rotation of the substrate, the cleaning-liquid supply position on the surface of the substrate is further moved toward the peripheral side of the substrate. In this case, along with the movement of the cleaning-liquid supply position on the surface of the substrate, the dry area formed on the central portion of the substrate spreads outward by an action of the centrifugal force. Thus, the cleaning liquid is discharged outward from recesses in the irregular pattern, and the resist dissolved substance is discharged together with the cleaning liquid. As a result, occurrence of the defective development can be restrained.

SUMMARY OF THE INVENTION

However, the defective development sometimes occurs even by the method of JP2006-080315A. The object of the present invention is to provide a substrate cleaning method, a substrate cleaning apparatus, and a computer-readable storage medium, which are capable of further restraining occurrence of the defective development.

Due to the extensive studies, the present inventors have found that an intermediate area (also referred to as "semi-dry area"), in which a cleaning liquid is in the course of drying on a surface of a substrate, may cause the defective development. The intermediate area means an area that is possibly present between a wet area, which spreads outward from the cleaning-liquid supply position, and the dry area. Depending on a size of the intermediate area, the cleaning liquid in the intermediate area is likely to break apart and scatter around (so-called "liquid scattering") by the centrifugal force caused by the rotation of the substrate, and the fractions of the cleaning liquid are likely to remain on the surface of the substrate (so-called "liquid remaining"). Since the resist dissolved substance is contained in the remaining liquid, the liquid remaining may result in defective development. The present inventors have made the present invention based on this knowledge.

Namely, the substrate cleaning method according to one aspect of the present invention includes: a first step in which, while a substrate is rotated, a cleaning liquid is ejected from a liquid nozzle positioned above the substrate, to a central portion of a surface of the substrate; a second step in which, after the first step, a dry gas is ejected from a gas nozzle positioned above the substrate, to the central portion of the surface of the substrate, so as to form a dry area on the central portion of the surface of the substrate; a third step in which, after the second step, the cleaning liquid is ejected from the liquid nozzle to the surface of the substrate, while the substrate is rotated and the liquid nozzle is moved from a central side of the substrate toward a peripheral side thereof; a fourth step in which a width of an intermediate area generated between a wet area, which spreads outward from a supply position of the cleaning liquid on the surface of the substrate, and the dry area is acquired; and a fifth step in which, when the width of the intermediate area exceeds a predetermined threshold value, a process parameter used for processing the substrate is changed such that the width of the intermediate area becomes the threshold value or less.

The larger the size of the intermediate area is, the more the defective development is likely to occur. This is because, when the intermediate area is large, a larger amount of the cleaning liquid is subjected to the centrifugal force by the rotation of the substrate, whereby the larger amount of the cleaning liquid breaks apart and scatters on the surface of the substrate. However, in the substrate cleaning method according to the one aspect of the present invention, when the width of the intermediate area, which is positioned between the wet area, which spreads outward from the supply position of the cleaning liquid on the surface of the substrate, and the dry area, exceeds the predetermined threshold value, the process parameter is changed such that the width of the intermediate area becomes the threshold value or less. Thus, since the width of the intermediate area is prevented from exceeding the predetermined value, the occurrence of liquid scattering which invites the defective development can be significantly restrained. As a result, occurrence of the defective development can be further restrained.

It may be provided that, in the fifth step, the process parameter to be changed includes at least one of a flow rate of the dry gas ejected from the gas nozzle, a moving speed of the liquid nozzle, a rotating speed of the substrate, and a distance between the gas nozzle and the surface of the substrate. It may be provided that, in the third step, the dry gas is ejected from the gas nozzle to the surface of the substrate, while the gas nozzle is moved from the central side of the substrate to the peripheral side thereof, with the gas nozzle being maintained to be positioned nearer to the central side of the substrate than the liquid nozzle, and in the fifth step, the process parameter to be changed includes at least one of a flow rate of the dry gas ejected from the gas nozzle, a moving speed of the liquid nozzle, a rotating speed of the substrate, and a distance between the gas nozzle and the surface of the substrate. By changing the process parameter(s) such that the width of the intermediate area becomes the threshold value or less, a robust control free of defect can be achieved even when the size of the intermediate area varies under the influence of disturbance.

It may be provided that the threshold value is a value set from a range between 5 mm and 15 mm.

It may be provided that, in the third step, the cleaning liquid is ejected from the liquid nozzle to the surface of the substrate while the substrate is rotated and the liquid nozzle is moved from the central side of the substrate toward the peripheral side thereof, and an image including a boundary part between the intermediate area and the dry area is acquired; and the fourth step includes: a first sub-step in which an outer periphery of the intermediate area is specified based on a position of the liquid nozzle; a second sub-step in which an inner periphery of the intermediate area is specified based on a variation of brightness values of pixels constituting the image; and a third sub-step in which the width of the intermediate area is determined based on a linear distance between the outer periphery of the intermediate area, which has been specified in the first sub-step, and the inner periphery of the intermediate area, which has been specified in the second sub-step. Since the intermediate area is a semi-dry area in which the cleaning liquid is in the course of drying on the surface of the substrate, interference fringes generally appear in the intermediate area. Thus, there is a brightness difference (contrast) between the intermediate area and the dry area. By processing the image of the boundary part between the intermediate area and the dry area to calculate a variation of the brightness value, the inner periphery of the intermediate area can be determined in a considerably precise manner.

A substrate cleaning apparatus according to a further aspect of the present invention includes: a rotary driving unit configured to rotate a substrate; a liquid nozzle positioned above the substrate and configured to eject a cleaning liquid to a surface of the substrate; a gas nozzle positioned above the substrate and configured to eject a dry gas to the surface of the substrate; an imaging unit positioned above the substrate and configured to image the surface of the substrate; and a control unit configured to control the rotary driving unit, the liquid nozzle, the gas nozzle, and the imaging unit; wherein the control unit is configured to perform: a first control in which the control unit controls the rotary driving unit and the liquid nozzle, such that the cleaning liquid is ejected from the liquid nozzle to a central portion of the surface of the rotating substrate; a second control in which, after the first control, the control unit controls the gas nozzle, such that the dry gas is ejected from the gas nozzle to the central portion of the surface of the substrate, so as to form a dry area on the central portion of the surface of the substrate; a third control in which, after the second control, the control unit controls the rotary driving unit, the liquid nozzle and the imaging unit, such that the cleaning liquid is ejected from the liquid nozzle to the surface of the rotating substrate while the liquid nozzle is moved from a central side of the substrate toward a peripheral side thereof, and that an image of the surface of the substrate is acquired by the imaging unit; a fourth control in which a width of an intermediate area generated between a wet area, which spreads outward from a supply position of the cleaning liquid on the surface of the substrate, and the dry area is determined by using the image; and a fifth control in which, when the width of the intermediate area exceeds a predetermined threshold value, a process parameter for processing the substrate is changed such that the width of the intermediate area becomes the threshold value or less.

Also in the substrate cleaning apparatus in the further aspect of the present invention, similarly to the substrate cleaning method according to the one aspect of the present invention, occurrence of the defective development can be further prevented.

It may be provided that the control unit includes, in the fifth control, as the process parameter to be changed, at least one of a flow rate of the dry gas ejected from the gas nozzle, a moving speed of the liquid nozzle, a rotating speed of the substrate, and a distance between the gas nozzle and the surface of the substrate. It may be provided that the control unit controls, in the third control, the gas nozzle, such that the dry gas is ejected from the gas nozzle to the surface of the substrate, while the gas nozzle is moved from the central side of the substrate to the peripheral side thereof, with the gas nozzle being maintained to be positioned nearer to the central side of the substrate than the liquid nozzle, and the control unit includes, in the fifth control, as the process parameter to be changed, at least one of a flow rate of the dry gas ejected from the gas nozzle, a moving speed of the liquid nozzle, a rotating speed of the substrate, and a distance between the gas nozzle and the surface of the substrate. By changing the process parameter(s) such that the width of the intermediate area becomes the threshold value or less, a robust control free of defect can be achieved even when the size of the intermediate area varies under the influence of disturbance.

It may be provided that the threshold value is a value set from a range between 5 mm and 15 mm.

It may be provided that the control unit performs in the fourth control: a first process in which an outer periphery of the intermediate area is specified based on a position of the liquid nozzle; a second process in which an inner periphery of the intermediate area is specified based on a variation of brightness values of pixels constituting the image; and a third process in which the width of the intermediate area is determined based on a linear distance between the outer periphery of the intermediate area, which has been specified in the first process, and the inner periphery of the intermediate area, which has been specified in the second process. The intermediate area is a semi-dry area in which the cleaning liquid is in the course of drying on the surface of the substrate. The cleaning liquid in the intermediate area is dried so that the thickness thereof is generally reduced to a thickness which may possibly cause interference fringes to appear. Thus, there is a brightness difference (contrast) between the intermediate area and the dry area. Therefore, by processing the image of the boundary part between the intermediate area and the dry area to calculate the variation of the brightness value, the inner periphery of the intermediate area can be determined in a considerably precise manner.

The substrate cleaning apparatus according to the further aspect of the present invention may further include a driving unit configured to move the imaging unit along the surface of the substrate, wherein the control unit controls, in the third control, the driving unit such that the imaging unit is moved to follow the boundary part that is moved along with the rotation of the substrate. In this case, since the imaging unit moves to follow the boundary part between the intermediate area and the dry area, the imaging by the imaging unit of the boundary part can be more reliably carried out, and the boundary part can be more clearly seen in the obtained image. Thus, the inner periphery of the intermediate area can be more precisely specified.

The computer-readable storage medium according to a further aspect of the present invention stores a program for causing a substrate cleaning apparatus to perform the aforementioned substrate cleaning method. Also in the computer-readable storage medium in the further aspect of the present invention, similarly to the substrate cleaning method according to the one aspect of the present invention, occurrence of the defective development can be further restrained. In this specification, the computer-readable storage medium includes a non-transitory tangible medium (non-transitory computer recording medium) (e.g., main memory or sub memory), or a transmission signal (transitory computer recording medium) (e.g., data signal that can be provided through a network).

BRIEF DESCRIPTION OF THE DRAWINGS

FIGS. 5A and 5B are top views showing the substrate processing apparatus.

FIGS. 6A and 6B are views for explaining a step of supplying a developer.

FIGS. 7A and 7B are views for explaining a step of supplying a cleaning liquid.

DETAILED DESCRIPTION OF THE INVENTION

Although an embodiment of the present invention will be described with reference to the drawings, the following embodiment is an example for explaining the present invention, and the present invention is not intended to be limited to the following contents. In the description, the same elements or elements having the same function are shown by the same reference number, and overlapping explanation is omitted.

Figure 1:
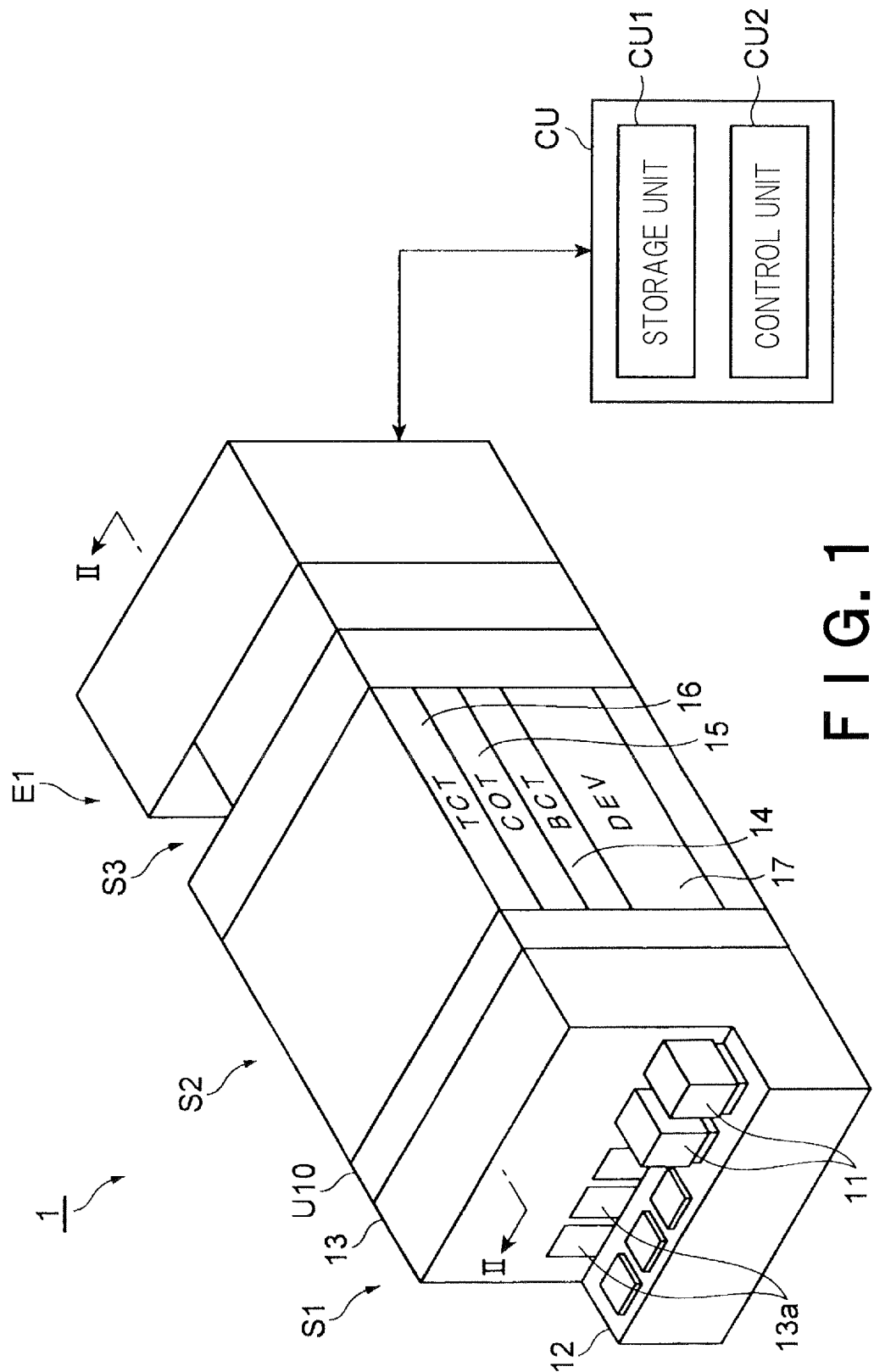
FIG. 1 is a perspective view showing a coating/developing system.
Figure 2:
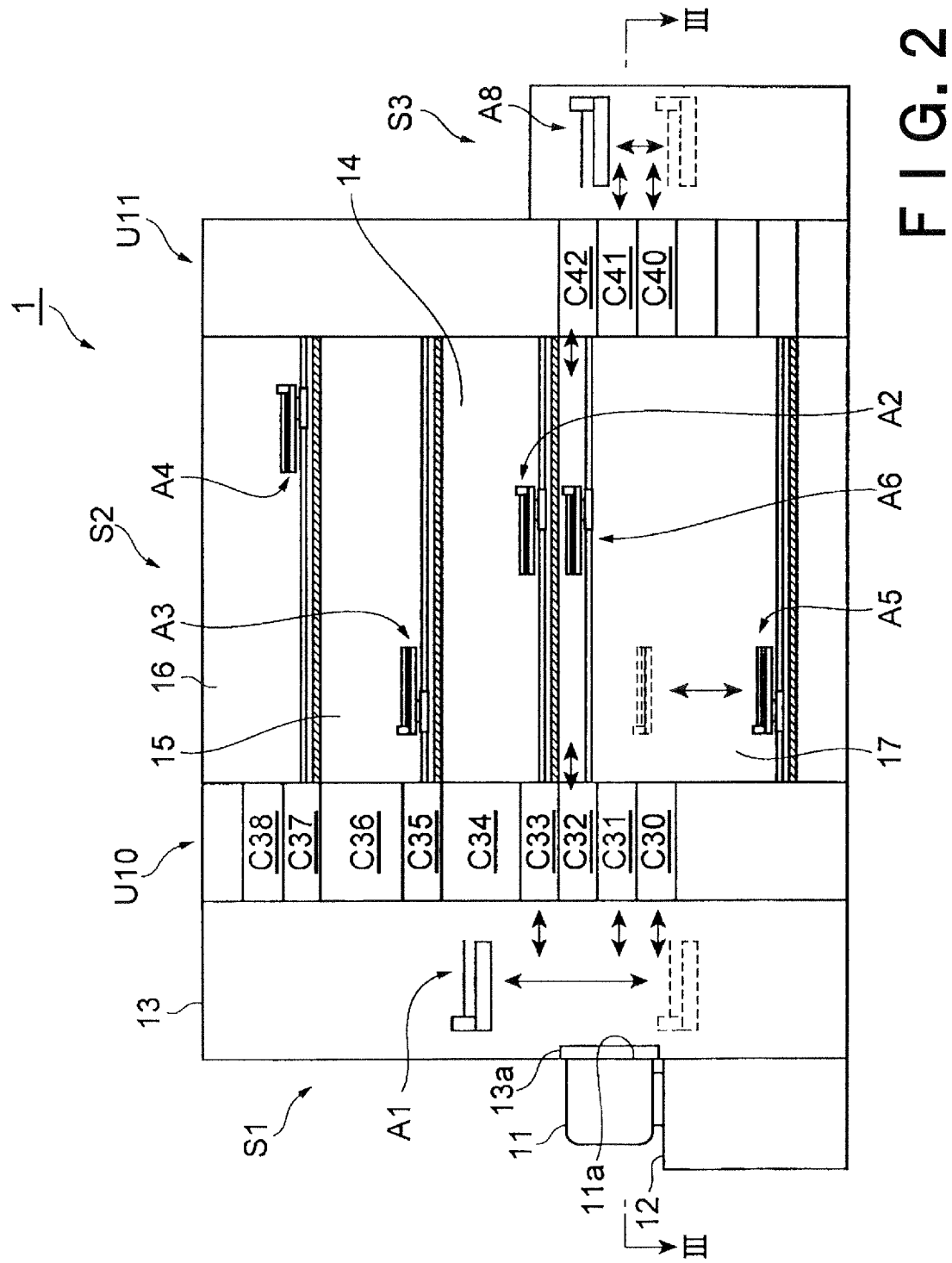
FIG. 2 is a sectional view taken along the line II-II in FIG. 1.
Figure 3:
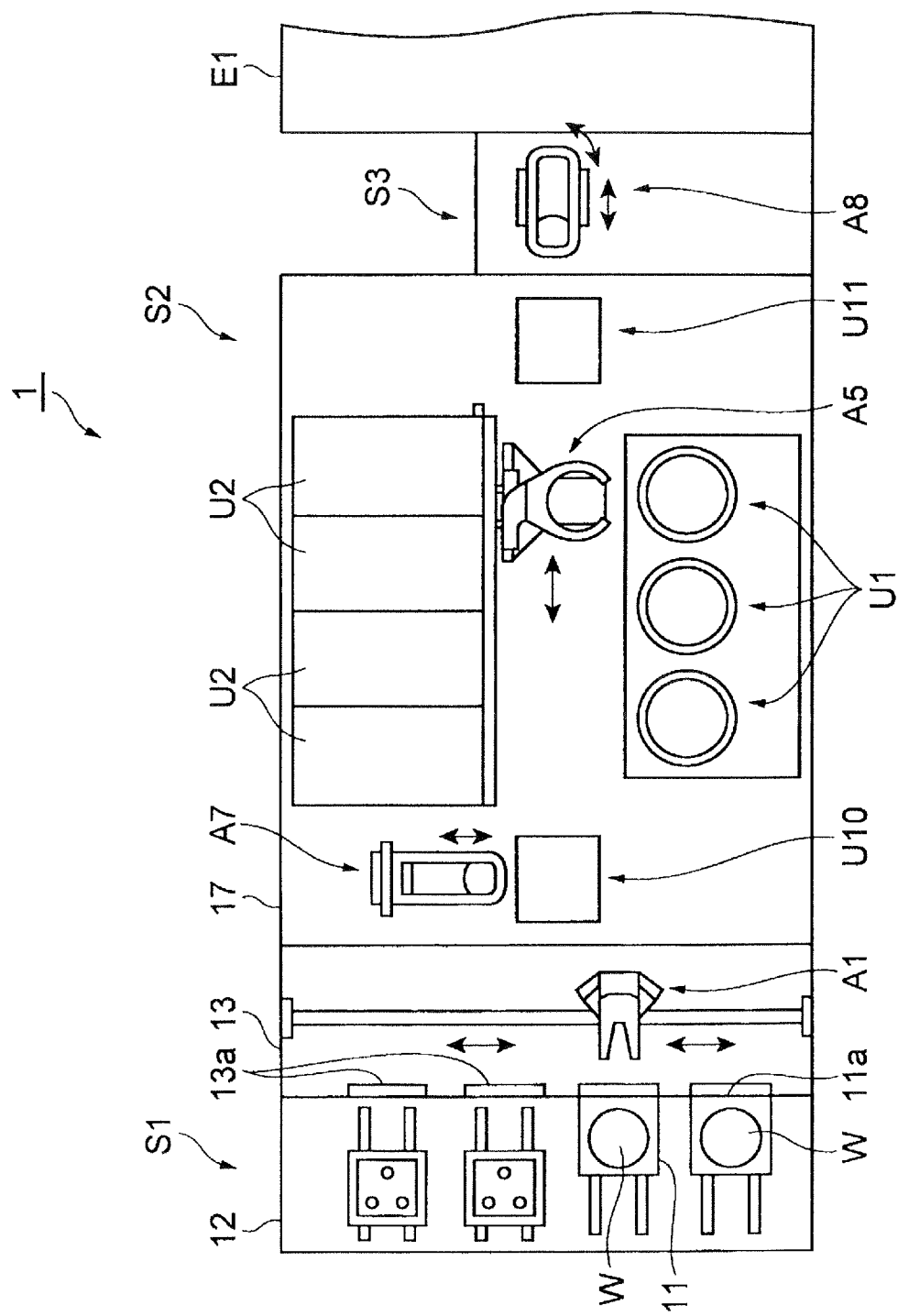
FIG. 3 is a sectional view taken along the line III-III in FIG. 2.

A schematic structure of the coating/developing apparatus 1 shown in FIGS. 1 to 3 is described. The coating/developing apparatus 1 is configured to coat a surface of a wafer (substrate) W with a resist material to form a resist film, before an exposure process performed by an exposure apparatus E1. The coating/developing apparatus 1 is configured to develop the resist film formed on the wafer W, after the exposure process to be performed by the exposure apparatus E1. In this embodiment, the wafer W has a discoid shape, but a partially cut circular wafer or a wafer having a shape other than the discoid shape, such as a polygonal shape, may be used.

As shown in FIGS. 1 and 2, the coating/developing apparatus 1 includes a carrier block S1, a processing block S2, an interface block S3, and a control apparatus CU that functions as control means of the coating/developing apparatus 1. In this embodiment, the carrier block S1, the processing block S2, the interface block S3 and the exposure apparatus E1 are arranged in series in this order.

As shown in FIGS. 1 and 3, the carrier block S1 has a carrier station 12, and a loading/unloading unit 13. The carrier station 12 supports a plurality of carriers 11. Each carrier 11 sealingly accommodates a plurality of wafers W. The carrier 11 has, on one side surface 11a, an opening and closing door (not shown) through which the wafers go in and out. The carrier 11 is removably placed on the carrier station 12 such that the side surface 11a faces the loading/unloading unit 13.

As shown in FIGS. 1 to 3, the loading/unloading unit 13 has opening and closing doors 13a respectively corresponding to the carriers 11 on the carrier station 12. When the opening and closing door of the side surface 11a and the opening and closing door 13a of the loading/unloading unit 13 are simultaneously opened, an inside of the carrier 11 and an inside of the loading/unloading unit 13 communicate with each other. As shown in FIGS. 2 and 3, the loading/unloading unit 13 incorporates a delivery arm A1. The delivery arm A1 is configured to take out a wafer W from the carrier 11 and to deliver the wafer W to the processing block S2. The delivery arm A1 is configured to receive a wafer W from the processing block S2 and to return the wafer W into the carrier 11.

As shown in FIGS. 1 to 3, the processing block S2 is adjacent to the carrier block S1 and is connected to the carrier block S1. As shown in FIGS. 1 and 2, the processing block S2 includes a lower antireflection-film forming (BCT) block 14, a resist-film forming (COT) block 15, an upper antireflection-film forming (TCT) block 16, and a developing (DEV) block 17. The DEV block 17, the BCT block 14, the COT block 15, and the TCT block 16 are juxtaposed in this order from a bottom side.

As shown in FIG. 2, the BCT block 14 incorporates a coating unit (not shown), a heating/cooling unit (not shown), and a transport arm A2 configured to transport a wafer W to these units. The coating unit is configured to apply a chemical liquid for forming an antireflection film to a surface of a wafer W. The heating/cooling unit is configured to heat the wafer W by a heating plate, for example, and is configured to cool thereafter the wafer W by a cooling plate, for example. In this manner, a lower antireflection film is formed on the surface of the wafer W.

As shown in FIG. 2, the COT block 15 incorporates a coating unit (not shown), a heating/cooling unit (not shown), and a transport arm A3 configured to transport a wafer W to these units. The coating unit is configured to apply a chemical liquid for forming a resist film (resist material) onto the lower antireflection film. The heating/cooling unit is configured to heat a wafer W by a heating plate, for example, and is configured to cool thereafter the wafer W by a cooling plate, for example. In this manner, a resist film is formed on the lower antireflection film of the wafer W. The resist material may be either of a positive type or of a negative type.

As shown in FIG. 2, the TCT block 16 incorporates a coating unit (not shown), a heating/cooling unit (not shown), and a transport arm A4 configured to transport a wafer W to these units. The coating unit is configured to apply a chemical liquid for forming an antireflection film onto the resist film. The heating/cooling unit is configured to heat the wafer W by a heating plate, for example, and is configured to cool thereafter the wafer W by a cooling plate, for example. In this manner, an upper antireflection film is formed on the resist film of the wafer W.

As shown in FIGS. 2 and 3, the DEV block 17 incorporates a plurality of developing units (substrate processing apparatuses) U1, a plurality of heating/cooling units (heat processing units) U2, a transport arm A5 configured to transport a wafer W to these units, and a transport arm A6 configured to transport a wafer W back and forth in the processing block S2, not by way of these units.

As described below, the developing unit U1 is configured to develop an exposed resist film. The heating/cooling unit U2 is configured to heat the resist film on the wafer W through the heating of the wafer W by a heating plate, for example. The heating/cooling unit U2 is configured to cool the heated wafer W by a cooling plate, for example. The heating/cooling unit U2 is configured to perform heating processes such as a post exposure baking process (PEB), a post baking process (PB) and so on. The PEB is a process for heating the resist film before the developing process. The PB is a process for heating the resist film after the developing process.

As shown in FIGS. 1 to 3, a shelf unit U10 is disposed in the processing block S2 on the side of the carrier block S1. The shelf unit U10 includes a plurality of cells C30 to C38. The cells C30 to C38 are juxtaposed in an up and down direction, between a height position corresponding to the DEV block 17 and a height position corresponding to the TCT block 16. An elevation arm A7 is provided in the vicinity of the shelf unit U10. The elevation arm A7 is configured to transport a wafer W among the cells C30 to C38.

A shelf unit U11 is disposed in the processing block S2 on the side of the interface block S3. The shelf unit U11 includes a plurality of cells C40 to C42. The cells C40 to C42 are juxtaposed in the up and down direction, adjacently to the DEV block 17.

As shown in FIGS. 1 to 3, the interface block S3 is positioned between the processing block S2 and the exposure apparatus E1, and is connected respectively to the processing block S2 and the exposure apparatus E1. As shown in FIGS. 2 and 3, the interface block S3 incorporates a delivery arm A8. The delivery arm A8 is configured to deliver a wafer W from the shelf unit U11 of the processing block S2 to the exposure apparatus E1. The delivery arm A8 is configured to receive a wafer W from the exposure apparatus E1 and to return the wafer W to the shelf unit U11.

The control apparatus CU is a computer for control, and includes a storage unit CU1 and a control unit CU2, as shown in FIG. 1. The storage unit CU1 stores a program for operating the respective units of the coating/developing apparatus 1 and the respective units of the exposure apparatus E1. The storage unit CU1 is a semiconductor memory, an optical recording disc, a magnetic recording disc, or a magnet optical recording disc, for example. The program may be stored in an external storage apparatus separate from the storage unit CU1 or an intangible medium such as a transmission signal. The program may be installed from these other media to the storage unit CU1 such that the storage unit CU1 stores the program. Based on the program read out from the storage unit CU1, the control unit CU2 is configured to control the respective units of the coating/developing apparatus 1 and the respective units of the exposure apparatus E1. The control apparatus CU may further include a display unit (not shown) for displaying a screen for setting a process condition, and an input unit (not shown) through which an operator can input a process condition, so that the respective units of the coating/developing apparatus 1 and the respective unit of the exposure apparatus E1 can be operated in accordance with a condition inputted through the input unit.

Next, a schematic operation of the coating/developing apparatus 1 is described. Firstly, the carrier 11 is placed on the carrier station 12. At this time, the one side surface 11a of the carrier 11 is directed to the opening and closing door 13a of the loading/unloading unit 13. Following thereto, the opening and closing door of the carrier 11 and the opening and closing door 13a of the loading/unloading unit 13 are opened, and wafers W in the carrier 11 are taken out by the delivery arm A1 and are sequentially transported to any of the cells in the shelf unit U10 of the processing block S2.

After the wafers W have been transported by the delivery arm A1 to any of the cells in the shelf unit U10, the wafers are sequentially transported by the elevation arm A7 to the cell C33 corresponding to the BCT block 14. Each wafer W having been transported to the cell C33 is transported by the transport arm A2 in each unit of the BCT block 14. In the course of the transportation of the wafer W by the delivery arm A2 in the BCT block 14, a lower antireflection film is formed on a surface of the wafer W.

The wafer W having the lower antireflection film formed thereon is transported by the transport arm A2 to the cell C34 above the cell C33. The wafer W having been transported to the cell C34 is transported by the elevation arm A7 to the cell C35 corresponding to the COT block 15. The wafer W having been transported to the cell C35 is transported by the transport arm A3 to each unit in the COT block 15. In the course of the transportation of the wafer W by the transport arm A3 in the COT block 15, a resist film is formed on the lower antireflection film.

The wafer W having the resist film formed thereon is transported by the transport arm A3 to the cell C36 above the cell C35. The wafer W having been transported to the cell C36 is transported by the elevation arm A7 to the cell C37 corresponding to the TCT block 16. The wafer W having been transported to the cell C37 is transported by the transport arm A4 to each unit in the TCT block 16. In the course of the transportation of the wafer W by the transport arm A4 in the TCT block 16, an upper antireflection film is formed on the resist film.

The wafer W having the upper antireflection film formed thereon is transported by the transport arm A4 to the cell C38 above the cell C37. The wafer W having been transported to the cell C38 is transported by the elevation arm A7 to the cell C32. Thereafter, the wafer W is transported by the transport arm A6 to the cell C42 of the shelf unit U11. The wafer W having been transported to the cell C42 is delivered to the exposure apparatus E1 by the delivery arm A8 of the interface block S3. In the exposure apparatus E1, the resist film is subjected to an exposure process. The exposed wafer W is transported by the delivery arm A8 to the cell C40 or C41 below the cell C42.

The wafer W having been transported to the cell C40 or C41 is transported by the transport arm A5 to each unit in the DEV block, so as to be developed. Thus, a resist pattern (irregular pattern) is formed on the surface of the wafer W. The wafer W having the resist pattern formed thereon is transported by the transport arm A5 to the cell C30 or C31 of the shelf unit U10, which corresponds to the DEV block 17. The wafer W having been transported to the cell C30 or C31 is transported by the elevation arm A7 to a cell accessible to the delivery arm A1, and is returned into the carrier 11 by the delivery arm A1.

The aforementioned structure and the operation of the coating/developing apparatus 1 is a mere example. It is sufficient that the coating/developing apparatus 1 includes a liquid processing unit such as a coating unit, a developing unit and so on, a preprocessing/postprocessing unit such as a heating/cooling unit, and a transport apparatus. Namely, the number, the type and the layout of these units can be suitably modified.

Figure 4:
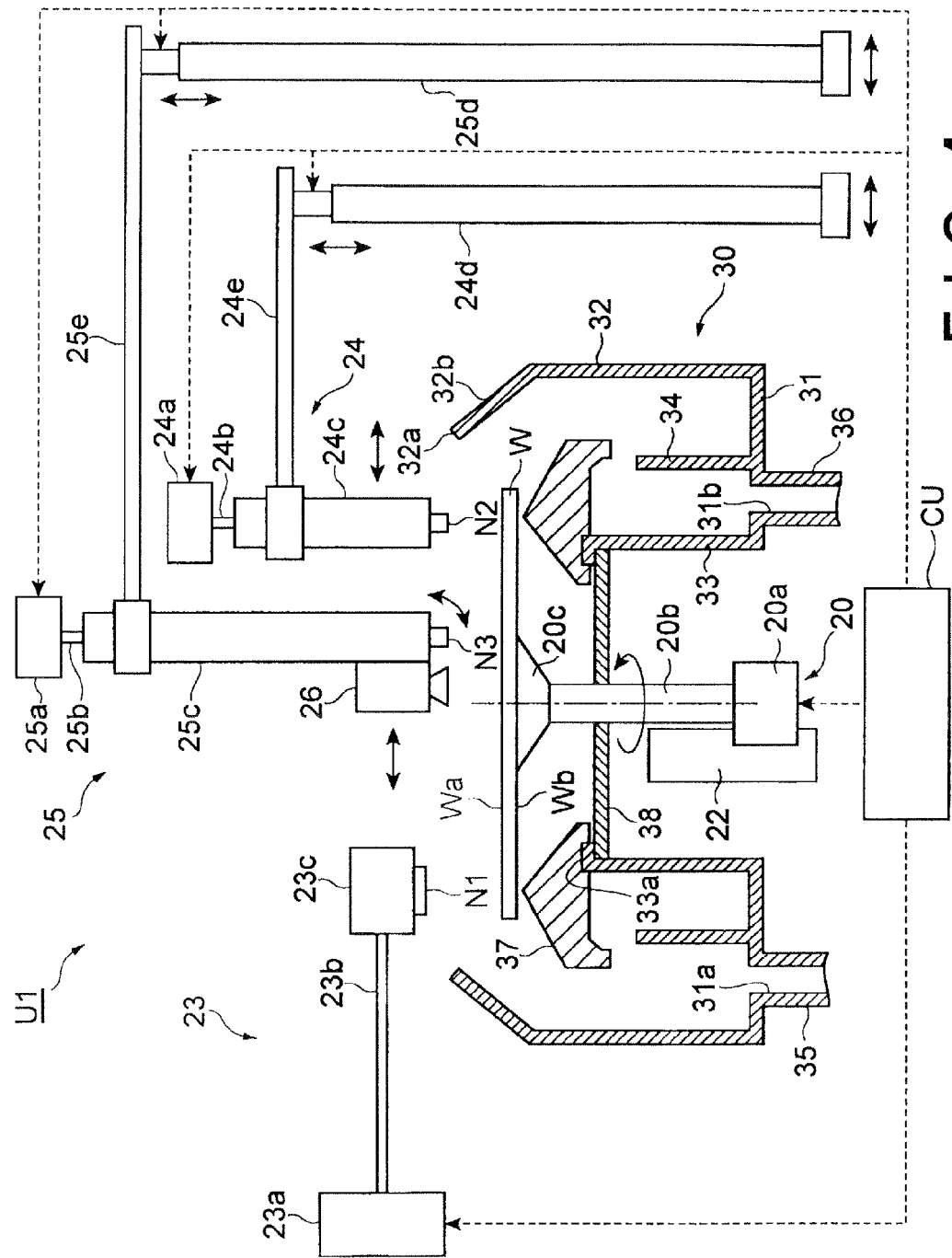
FIG. 4 is a sectional view showing a substrate processing apparatus.

Next, the developing unit (substrate processing apparatus) U1 is described in more detail. As shown in FIG. 4, the developing unit U1 includes a rotary holding unit 20, an elevation apparatus 22, a developer supply unit 23, a cleaning-liquid supply unit 24, a dry-gas supply unit 25, and an imaging unit 26.

The rotary holding unit 20 includes a body part 20a incorporating a power source such as an electric motor, a rotating shaft 20b extending vertically upward from the body part 20a, and a chuck 20c provided on a distal end of the rotating shaft 20b. The body part 20a is configured to rotate the rotating shaft 20b and the chuck 20c by means of the power source. The chuck 20c is configured to support a central portion of a wafer W, so as to hold the wafer W substantially horizontally by, e.g., sucking the wafer W. Namely, the rotary holding unit 20 is configured to rotate the wafer W about a central axis (vertical axis) perpendicular to the surface of the wafer W, while a posture of the wafer W is in the substantially horizontal state. In this embodiment, as shown in FIG. 4 and so on, when seen from above, the rotary holding unit 20 is configured to rotate the wafer W in the counterclockwise direction.

The elevation apparatus 22 is mounted to the rotary holding unit 20, and is configured to move up and down the rotary holding unit 20. Specifically, the elevation apparatus 22 is configured to move up and down the rotary holding unit 20 (chuck 20c) between an elevated position (transfer position), at which the wafer W is transferred between the transport arm A5 and the chuck 20c, and a lowered position (developing position), at which the wafer W is developed.

A cup 30 is disposed around the rotary holding unit 20. When the wafer W is rotated, a liquid (described in detail below), which is supplied to the surface of the wafer W, is circumferentially spun off to fall down. The cup 30 functions as a container for receiving the falling down liquid. The cup 30 includes an annular bottom plate 31 surrounding the rotary holding unit 20, a cylindrical outer wall 32 projecting vertically upward from an outer periphery of the bottom plate 31, and a cylindrical inner wall 33 projecting vertically upward from an inner periphery of the bottom plate 31.

The whole part of the outer wall 32 is positioned outside the wafer W held by the chuck 20c. An upper end 32a of the outer wall 32 is positioned above the wafer W which is held by the rotary holding unit 20 located at the lowered position. A part of the outer wall 32 near the upper end 32a defines an inclined wall part 32b that is inclined inward as a certain point on the part moves upward. The whole part of the inner wall 33 is positioned inside a periphery of the wafer W held by the chuck 20c. An upper end 33a of the inner wall 33 is positioned below the wafer W which is held by the rotary holding unit 20 located at the lowered position.

A partition wall 34, which projects vertically upward from an upper surface of the bottom plate 31, is disposed between the inner wall 33 and the outer wall 32. Namely, the partition wall 34 surrounds the inner wall 33. A liquid discharge hole 31a is formed in the bottom plate 31 at a position between the outer wall 32 and the partition wall 34. A drain pipe 35 is connected to the liquid discharge hole 31a. A gas discharge hole 31b is formed in the bottom plate 31 at a position between the partition wall 34 and the inner wall 33. An exhaust pipe 36 is connected to the gas discharge hole 31b.

An umbrella-like part 37, which protrudes outward beyond the partition wall 34, is disposed above the inner wall 33. The liquid, which has been spun off outward from the wafer W to fall down, is introduced to a space between the outer wall 32 and the partition wall 34 so as to be discharged from the liquid discharge hole 31a. A gas generated from the liquid comes into a space between the partition wall 34 and the inner wall 33, so as to be discharged from the gas discharge hole 31b.

An upper part of the space surrounded by the inner wall 33 is closed by a partition plate 38. The body part 20a of the rotary holding unit 20 is positioned below the partition plate 38. The chuck 20c is positioned above the partition plate 38. The rotating shaft 20b is inserted to a through-hole formed in a central portion of the partition plate 38.

As shown in FIG. 4, the developer supply unit 23 includes a supply source 23a of a developer (processing liquid), a head part 23, and a not-shown mobile body. The supply source 23a includes a developer container, a pump, a valve and so on. The head part 23c is connected to the supply source 23a through a supply pipe 23b. The head part 23c is positioned above a surface Wa of a wafer W, when the developer is supplied. A nozzle N1 disposed on the head part 23c is opened downward toward the surface Wa of the wafer W. Thus, upon receipt of a control signal from the control apparatus CU, the head part 23c is configured to eject the developer, which has been supplied from the supply source 23a, from the nozzle N1 to the surface Wa of the wafer W.

Upon receipt of a control signal from the control apparatus CU, the mobile body is configured to horizontally move the head part 23c. Thus, the head part 23c is moved above the wafer W located at the lowered position, along a line perpendicular to the central axis of the wafer W, in a radial direction of the wafer W.

As shown in FIG. 4, the cleaning-liquid supply unit 24 includes a supply source 24a of a cleaning liquid (rinse liquid), a head part 24c, and a mobile body 24d. The supply source 24a includes a cleaning-liquid container, a pump, a valve and so on. The cleaning liquid is pure water or DIW (Deionized Water), for example. The head part 24c is connected to the supply source 24a through a supply pipe 24b. The head part 24c is located above the surface Wa of the wafer W, when the cleaning liquid is supplied. A nozzle N2 disposed on the head part 24c is opened downward toward the surface Wa of the wafer W. Thus, upon receipt of a control signal from the control apparatus CU, the head part 24c is configured to eject the cleaning liquid, which has been supplied from the supply source 24a, from the nozzle N2 to the surface Wa of the wafer W.

The mobile body 24d is connected to the head part 24c through an arm 24e. Upon receipt of a control signal from the control apparatus CU, the mobile body 24d is configured to horizontally move above a guide rail (not shown). Thus, the head part 24c is configured to horizontally move above the wafer W located at the lowered position, along a line perpendicular to the central axis of the wafer W, in the radial direction of the wafer W. Upon receipt of a control signal from the control apparatus CU, the mobile body 24d is configured to move up and down the arm 24e. Thus, the head part 24c is moved in the up and down direction to come close to or away from the surface Wa of the wafer W.

As shown in FIG. 4, the dry-gas supply unit 25 includes a supply source 25a of a dry gas, a head part 25c and a mobile body 25d. The supply source 25a includes a dry-gas container, a pump, a valve and so on. The dry gas is an inert gas such as nitrogen, for example. The head part 25c is connected to the supply source 25a through a supply pipe 25b. The head part 25c is positioned above the surface Wa of the wafer W. A nozzle N3 disposed on the head part 25c is opened downward toward the surface Wa of the wafer W. Thus, upon receipt of a control signal from the control apparatus CU, the head part 25c is configured to eject the dry gas, which has been supplied from the supply source 25a, from the nozzle N3 to the surface Wa of the wafer W. The nozzle N3 has a distal end that is rotatable along the radial direction of the wafer W at one degree of freedom (see FIG. 4). To be specific, the nozzle N3 can take a state in which a normal line of an ejection port of the nozzle N3 is perpendicular to the surface Wa of the wafer W, and a state in which the ejection port is inclined toward the peripheral side of the wafer W (toward the nozzle N2) with respect to the surface Wa of the wafer W.

The mobile body 25d is connected to the head part 25c through the arm 25e. Upon receipt of a control signal from the control apparatus CU, the mobile body 25d is configured to horizontally move above a guide rail (not shown). Thus, the head part 25c is horizontally moved above the wafer W located at the lowered position, along a line perpendicular to the central axis of the wafer W, in the radial direction of the wafer W. Upon receipt of a control signal from the control apparatus CU, the mobile body 25d is configured to move up and down the arm 25e. Thus, the head part 25c is moved in the up and down direction to come close to or away from the surface Wa of the wafer W.

FIGS. 5A and 5B show an example of a layout of the cleaning-liquid supply unit 24 and the dry-gas supply unit 25. When seen from above, the cleaning-liquid supply unit 24 and the dry-gas supply unit 25 are located such that the nozzles N2 and N3 (head parts 24c and 25c) are juxtaposed along the radial direction of the wafer W. In a cleaning step of the wafer W, the nozzles N2 and N3 (head parts 24c and 25c) are moved from a position near the center of the wafer W toward the peripheral side thereof, details of which will be described later. On the assumption of this movement direction as a reference, the nozzle N3 (head part 25c) is positioned nearer to the start position of movement than the nozzle N2 (head part 24c).

The head parts 24c and 25c are horizontally moved independently of each other, by the control apparatus CU, through the respective arms 24e and 25e. Similarly, the head parts 24c and 25c are moved up and down independently of each other, by the control apparatus CU, through the respective arms 24e and 25e. In the example shown in FIG. 5A, the head parts 24c and 25c are moved in the same direction as the direction in which the arms 24e and 25e extend. On the other hand, in the example shown in FIG. 5B, the head parts 24c and 25c are moved in the direction perpendicular to the direction in which the arms 24e and 25e extend.

The imaging unit 26 is positioned above the surface Wa of the wafer W, and is configured to image the surface Wa of the wafer W. In this embodiment, the imaging unit 26 is provided in the vicinity of a distal end of the head part 25c so as to be moved together with the head part 25c (see FIGS. 4, 5A and 5B). On the assumption of the movement direction of the nozzles N2 and N3 as a reference, the imaging unit 26 is positioned nearer to the start position of movement than the nozzle N3 (head part 25c). In the below-described cleaning step, a boundary between an intermediate area D2 and a dry area D3 may exist on the surface Wa of the wafer W below the head part 25c (nozzle N3), and the boundary moves toward the peripheral side of the wafer W along with the movement of the nozzles N2 and N3 (head parts 24c and 25c). The imaging unit 26 disposed in the vicinity of the distal end of the head part 25c is moved synchronically not only with the head part 25c but also with the boundary so as to continuously image the boundary and a part therearound.

Next, a method of forming a resist pattern (irregular pattern) on the surface Wa of the wafer W by using the developing unit U1 is described in detail. A developing step is firstly explained. The control apparatus CU gives a command to the elevation apparatus 22, such that the chuck 20c is elevated up to the elevated position. Under this condition, a wafer W is loaded into the developing unit U1 by the transport arm A5. Before the wafer W is loaded into the developing unit U1, a resist film R (see FIGS. 6A and 6B) has been formed on the surface Wa of the wafer W, and the resist film R has been subjected to the exposure process by the exposure apparatus E1.

The wafer W is placed on the chuck 29c in such a manner that the surface Wa on which the resist film R is provided faces upward. Then, the control apparatus CU gives a command to the chuck 20c, such that the wafer W is sucked and held by the chuck 20c. After that, the control apparatus CU gives a command to the elevation apparatus 22, such that the chuck 20c is lowered to the lowered position.

Following thereto, the control apparatus CU gives a command to the rotary holding unit 20 (body part 20a), such that the wafer W is rotated (see FIG. 6A). In this embodiment, the wafer W is rotated in the counterclockwise direction, when seen from above. The control apparatus CU gives a command to the mobile body (not shown) and the supply source 23a of the developer supply unit 23, such that the developer L1 is ejected from the nozzle N1 to the surface Wa of the wafer W, while the head part 23c is moved from the peripheral side of the wafer W toward the central side thereof during the rotation of the wafer W (see FIG. 6A). Thus, the developer L1 is supplied in a spiral manner on the surface Wa of the wafer W from the peripheral side of the wafer W toward the central side thereof, so that the whole surface Wa of the wafer W is covered with the developer L1 (see FIG. 6B). Then, the control apparatus CU gives a command to the mobile body (not shown) and the supply source 23a of the developer supply unit 23, such that the ejection of the developer L1 from the nozzle N1 is stopped, and that the head part 23c is retracted outside the wafer W. In the above manner, the developing step is finished.

Next, the cleaning step is described. The control apparatus CU gives a command to the mobile bodies 24d and 25d, such that the head parts 24c and 25c are moved to the central portion of the wafer W. When the nozzle N2 reaches the substantially central portion of the wafer W, the control apparatus CU gives a command to the supply source 24a, such that a cleaning liquid L2 is ejected from the nozzle N2 to the surface Wa of the rotating wafer W (see FIG. 7A). A lower limit of the rotating speed ω of the wafer W at this time may be either about 500 rpm or about 1000 rpm, for example. An upper limit of the rotating speed ω of the wafer W at this time may be about 1500 rpm or about 1000 rpm, for example. A lower limit of the ejection time of the cleaning liquid L2 from the nozzle N2 may be either about 15 seconds or about 30 seconds, for example. An upper limit of the ejection time of the cleaning liquid L2 from the nozzle N2 may be either about 60 seconds or about 30 seconds, for example.

A substance of the dissolved resist, which has been dissolved by a reaction between the exposed resist film R and the developer L1, is flushed together with the developer L1 by the cleaning liquid L2 (see FIG. 7B). The dissolved resist substance, the developer L1 and the cleaning liquid L2 are spun off around the wafer W to fall down, by the centrifugal force caused by the rotation of the wafer W.

Thus, a resist pattern RP is formed on the surface Wa of the wafer W (see FIG. 7B). The resist pattern RP is an irregular pattern including projections Ra and recesses Rb.

Then, while the rotation of the wafer W and the ejection of the cleaning liquid L2 from the nozzle N2 are continued, the control apparatus CU gives a command to the mobile bodies 24d and 25d, such that the head parts 24c and 25c are moved toward the peripheral side of the wafer W. When the nozzle N3 reaches the substantially central portion of the wafer W, the control apparatus CU gives a command to the supply source 25a, such that a dry gas G is ejected from the nozzle N3 during the rotation of the wafer W (see FIG. 8A). A time period from when the ejection of the dry gas G is started to when the ejection of the dry gas G is finished can be set to be about 5 seconds, for example.

Figure 8A:
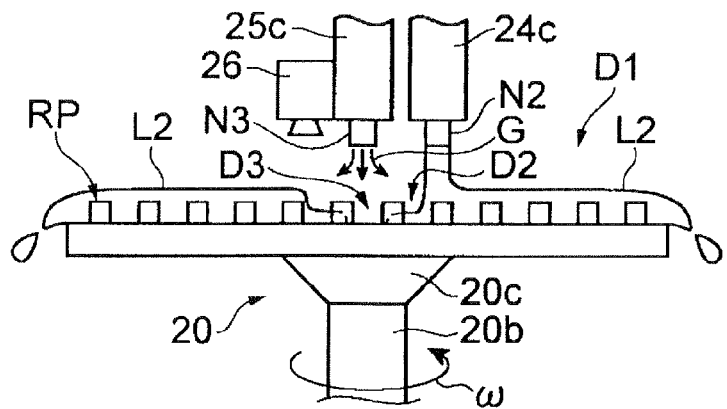
FIGS. 8A to 8D are views for explaining a step of supplying the cleaning liquid and a drying gas.

Thus, the cleaning liquid L2 on the central portion of the wafer W is circumferentially spun off and evaporated, so that the dry area D3 is formed on the central portion of the wafer W (see FIGS. 5 and 8A). Herein, the dry area D3 is an area where the cleaning liquid L2 is evaporated whereby the surface Wa of the wafer W is exposed. Note that, if the surface Wa has only a little bit of (e.g., micro order) droplets, such an area is regarded as the dry area. The dry area D3 spreads from the central portion of the wafer W toward the peripheral side thereof, by the centrifugal force caused by the rotation of the wafer W.

On the other hand, the cleaning liquid L2 ejected from the nozzle N2 spreads toward the peripheral side of the wafer W, by the centrifugal force caused by the rotation of the wafer W. Thus, an area from the position of the nozzle N2 to the periphery of the wafer W is a wet area D1 to which the cleaning liquid L2 is sufficiently supplied to the surface Wa of the wafer W (see FIGS. 5 and 8A). There is the intermediate area D2 (also referred to as "semi-dry area") between the wet area D1 and the dry area D3 (see FIGS. 5 and 8A). In the intermediate area D2, the cleaning liquid L2 is in the course of drying on the surface Wa of the wafer W. Thus, a thickness of the cleaning liquid L2 in the intermediate area D2 is smaller than a thickness of the cleaning liquid L2 on the wet area D1.

Figure 8B:
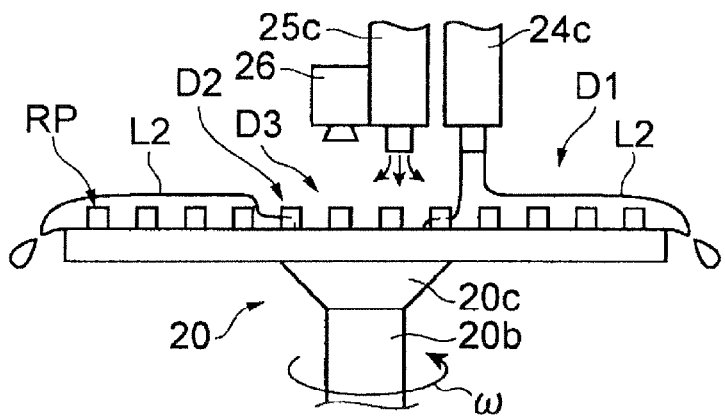
Figure 8C:
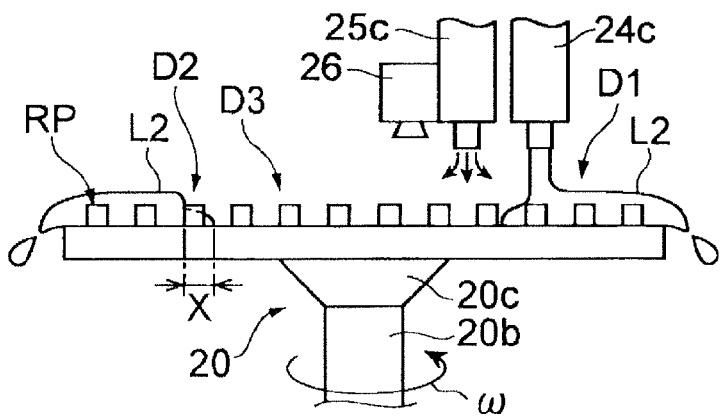

Then, while the rotation of the wafer W and the ejection of the cleaning liquid L2 from the nozzle N2 are continued, the control apparatus CU gives a command to the mobile bodies 24d and 25d, such that the head parts 24c and 25c are further moved toward the periphery of the wafer W (see FIGS. 8B and 8C). At this time, the nozzle N3 may not eject the dry gas G. Alternatively, while the nozzle N3 is maintained to be positioned nearer to the central side of the wafer W than the nozzle N2, the control apparatus CU gives a command to the mobile bodies 24d and 25d, such that the ejection of the dry gas G from the nozzle N3 is continued while the nozzle N3 is moved together with the nozzle N2 toward the periphery of the wafer W.

Figure 8D:
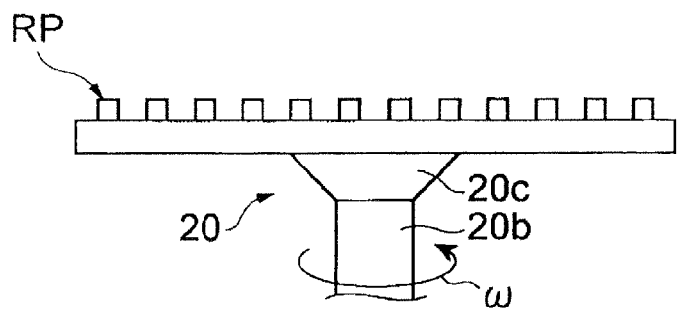

Thereafter, the cleaning of the whole surface Wa of the wafer W is finished. Then, the control apparatus gives a command to the mobile bodies 24d and 25d and the rotary holding unit 20 (body part 20a), such that the head parts 24c and 25c are moved outside the wafer W, and thereafter the wafer W is rotated at a predetermined rotating speed so as to be dried (see FIG. 8D). The rotating speed ω of the wafer W at this time may be about 1500 rpm to 2000 rpm, for example. In the above manner, the cleaning step is finished.

With these steps, the resist pattern (irregular pattern) RP is formed on the surface Wa of the wafer W. Thus, the developing unit U1 functions as an apparatus for cleaning the wafer W in the developing process.

In this embodiment, from a time at which the dry area D3 is formed on the surface Wa of the wafer W (see FIG. 8A) to a time at which the cleaning step is finished (see FIG. 8D), the control apparatus CU performs an acquisition step in which a width X of the intermediate area D2 (see, e.g., FIG. 5A or 8A) formed on the surface Wa of the wafer W is acquired. When the control apparatus CU judges whether the width X exceeds a predetermined threshold value or not, and judges that the width X exceeds the predetermined threshold value, the control apparatus CU is configured to perform a changing process in which a process parameter used for processing the wafer W are changed such that the width X becomes the threshold value or less.

A lower limit of the threshold value may be about 5 mm, for example. An upper limit of the threshold value may be about 15 mm, for example. The threshold value may be a value set from a range between 5 mm and 15 mm, or may be about 10 mm.

The process parameter changed by the changing process may be immediately fed back in the same cleaning step in which the acquisition process is performed, so that the process of the wafer W is changed on a real-time basis. The process parameter changed by the changing process may be used in the process of the wafer W in a later cleaning step succeeding to the cleaning step in which the acquisition process is performed. When the width X is judged to exceed a predetermined threshold value, the wafer W may be marked for distinguishing it from other wafers, on the assumption that the wafer W has a defect, and the wafer W may be processed differently from the other wafers. For example, the following methods are possible. The wafer W is regarded as a defective wafer and is returned to the carrier 11 without subjecting it to a succeeding process. Alternatively, the resist pattern PR on the wafer W is removed, the patterning is performed once again from the coating step, and the exposure step, the developing step and the cleaning step are performed again. In addition, when the width X exceeds a predetermined threshold value, an alarm may be merely issued.

The width X of the intermediate area D2 may be defined as a linear distance between a boundary, which is between the intermediate area D2 and the wet area D1, and a boundary, which is between the intermediate area D2 and the dry area D3. The boundary between the intermediate area D2 and the wet area D1 forms an outer periphery of the intermediate area D2. The boundary between the intermediate area D2 and the dry area D3 forms an inner periphery of the intermediate area D2.

Since the cleaning liquid L2 is continuously ejected from the nozzle N2 in the wet area D1, the thickness of the cleaning liquid L2 in the wet area D1 is large. Since the cleaning liquid L2 is completely or almost dried in the dry area D3, the thickness of the cleaning liquid L2 in the dry area D3 is 0 or very small. Namely, the thickness of the cleaning liquid L2 in the intermediate area D2 is larger than the thickness of the cleaning liquid L2 in the dry area D3, and is smaller than the thickness of the cleaning liquid L2 in the wet area D1. The thickness of the cleaning liquid L2 in the intermediate area D2 generally causes interference fringes to appear in the intermediate area D2. Thus, the inner periphery and the outer periphery of the intermediate area D2 may be specified based on the thickness of the cleaning liquid L2 in the intermediate area D2 as a reference, or may be specified based on the interference fringes in the intermediate area D2, which are observed from outside, as a reference, for example.

The cleaning liquid L2 ejected from the nozzle N2 moves toward the periphery of the wafer W because of the centrifugal force. Thus, the boundary between the intermediate area D2 and the wet area D1 (outer periphery of the intermediate area D2) substantially conforms to the position of the nozzle N2. To be specific, the boundary substantially conforms to a rear peripheral position of the nozzle N2 in the traveling direction (when seen from above, a peripheral position of the nozzle N2 nearer to the central side of the wafer W). Thus, the outer periphery of the intermediate area D2 may be specified based on the position of the nozzle N2.

On the other hand, the inner periphery of the intermediate area D2 may be specified with the image processing by using the imaging unit 26, which is as follows. Since the interference fringes appear in the intermediate area D2, there is a brightness difference (contrast) between the intermediate area D2 and the dry area D3. Thus, the imaging unit 26 images the boundary part between the intermediate area D2 and the dry area D3 to generate an image, and the imaging unit 26 transmits the image to the control apparatus CU. Then, the control apparatus CU processes the received image to calculate a variation (difference) of brightness values of the plurality of pixels constituting the boundary part between the intermediate area D2 and the dry area D3 in the image. Then, the control apparatus CU compares the calculated variation with a preset reference value, and selects pixels larger than the reference value. The control apparatus CU specifies a location corresponding to the selected pixels, as the inner periphery of the intermediate area D2.

When the inner periphery of the intermediate area D2 is specified through the image processing by using the imaging unit 26, the imaging unit 26 may image a distal end part of the nozzle N3, in addition to the boundary part between the intermediate area D2 and the dry area D3. In this case, even when a variation of the brightness values is not so large, the boundary part between the intermediate area D2 and the dry area D3 can be easily specified due to the presence of the nozzle N3 in the image.

At least one of (A) a flow rate of the dry gas G ejected from the nozzle N3, (B) a moving speed of the nozzle N3, (C) a moving speed of the nozzle N2, (D) a rotating speed ω of the wafer W, and (E) a distance between the nozzle N3 and the surface Wa of the wafer W, may be changed as the process parameter. By changing the process parameter(s) such that the width X of the intermediate area D2 becomes the threshold value or less, a robust control free of defect can be achieved even when the size of the intermediate area D2 varies under the influence of disturbance.

As to the parameter (A), the larger the flow rate of the dry gas G ejected from the nozzle N3 is, the more the cleaning liquid L2 on the surface Wa of the wafer W is likely to dry. Thus, the width X of the intermediate area D2 tends to reduce. As to the parameters (B) and (C), although the nozzles N2 and N3 are generally moved at substantially the same speed, when the width X of the intermediate area D2 increases, at least one of the moving speeds of the nozzle N2 and N3 is controlled such that the nozzle N2 and the nozzle N3 come closer to each other. Both the moving speeds of the nozzles N2 and N3 may be decreased.

As to the parameter (D), the higher the rotating speed of the wafer W is, the greater the centrifugal force acting on the cleaning liquid L2 on the surface Wa of the wafer W becomes. Thus, the width X of the intermediate area D2 tends to reduce. As to the parameter (E), the smaller the distance between the nozzle N3 and the surface Wa of the wafer W is, the faster a flow speed of the dry gas G blown to the surface Wa of the wafer W becomes, whereby the cleaning liquid L2 on the surface Wa of the wafer W is more likely to be eliminated by the drying gas G. Thus, the width X of the intermediate area D2 tends to reduce.

As another process parameter, (F) a direction of the nozzle N3 or (G) a flow rate of the cleaning liquid L2 ejected from the nozzle N2 may be taken by way of example. As to the parameter (F), when the direction of the nozzle N3 is substantially 45° with respect to the surface Wa of the wafer W, the dry gas G ejected from the nozzle N3 can be directly and efficiently blown to the inner periphery of the intermediate area D2. Thus, the width X of the intermediate area D2 tends to reduce. As to the parameter (G), when the flow rate of the cleaning liquid L2 ejected from the nozzle N2 is decreased, there is a possibility that the cleaning liquid L2 interrupts on the surface Wa of the wafer W whereby the inner periphery of the intermediate area D2 cannot be specified based on the image imaged by the imaging unit 26. Namely, although the parameter (G) does not have a direct impact on the control of the width X of the intermediate area D2, the parameter (G) is controlled as one of elements for holding the intermediate area D2.

In the above embodiment, when the width X of the intermediate area D2, which is positioned between the wet area D1, which spreads outward from the supply position of the cleaning liquid L2 on the surface Wa of the wafer W, and the dry area D3, exceeds a predetermined threshold value, the process parameter(s) is changed such that the width of the intermediate area D2 becomes the threshold value or less. Thus, since the width X of the intermediate area D2 is prevented from exceeding the predetermined value, the occurrence of liquid scattering which invites the defective development can be significantly restrained. As a result, occurrence of the defective development can be further restrained. Moreover, when the moving speeds of the nozzles N2 and N3 are made faster as long as the width X does not exceed the predetermined threshold value, the process time can be shortened, which greatly contributes to improvement in productivity.

In this embodiment, the control apparatus CU calculates a variation of brightness values in the boundary part between the intermediate area D2 and the dry area D3, based on the image imaged by the imaging unit 26. Thus, the inner periphery of the intermediate area D2 can be determined in a considerably precise manner.

In this embodiment, the imaging unit 26 is moved synchronically not only with the head part 25c but also with the boundary between the intermediate area D2 and the dry area D3 so as to continuously image the boundary and a part therearound. Thus, the imaging by the imaging unit 26 of the boundary part between the intermediate area D2 and the dry area D3 can be more reliably carried out, and the boundary part can be more clearly seen in the obtained image. Thus, the inner periphery of the intermediate area D2 can be more precisely specified.

In this embodiment, the dry area D3 is formed on the central portion of the surface Wa of the wafer W by ejecting the dry gas G from the nozzle N3. Thus, along with the movement of the head parts 24c and 25c toward the peripheral portion of the wafer W, the dry area D3 formed on the central portion of the wafer W spreads outward by an action of the centrifugal force. Thus, the cleaning liquid L2 is discharged outward from the inside of each recess Rb of the resist pattern RP, whereby the dissolved resist substance can be removed together with the cleaning liquid L2. In addition, since spattering of the liquid is unlikely to occur, occurrence of the defective development can be greatly restrained.

Although the embodiment of the present invention has been described in detail above, the present invention is not limited thereto. For example, the imaging unit 26 may be configured to move horizontally or vertically, independently of the head parts 24*c* and 25*c*. The imaging unit 26 may be fixed on a side wall or a top wall of the developing unit U1 so as to be immovable. In any case, the image imaged by the imaging unit 26 can be used in a process for specifying the inner periphery of the intermediate area D2.

The nozzles N2 and N3 may be provided in the same head.

What is claimed is:

1. A substrate cleaning method comprising:
   a first step in which, while a substrate is rotated, a cleaning liquid is ejected from a liquid nozzle positioned above the substrate, to a central portion of a surface of the substrate;
   a second step in which, after the first step, a dry gas is ejected from a gas nozzle positioned above the substrate, to the central portion of the surface of the substrate, so as to form a dry area on the central portion of the surface of the substrate;
   a third step in which, after the second step, the cleaning liquid is ejected from the liquid nozzle to the surface of the substrate, while the substrate is rotated and the liquid nozzle is moved from a central side of the substrate toward a peripheral side thereof;
   a fourth step in which a width of an intermediate area generated between a wet area, which spreads outward from a supply position of the cleaning liquid on the surface of the substrate, and the dry area is acquired; and
   a fifth step in which, when the width of the intermediate area exceeds a predetermined threshold value, a process parameter used for processing the substrate is changed such that the width of the intermediate area becomes the threshold value or less.

2. The substrate cleaning method according to claim 1, wherein
   in the fifth step, the process parameter to be changed includes at least one of a flow rate of the dry gas ejected from the gas nozzle, a moving speed of the liquid nozzle, a rotating speed of the substrate, and a distance between the gas nozzle and the surface of the substrate.

3. The substrate cleaning method according to claim 1, wherein
   in the third step, the dry gas is ejected from the gas nozzle to the surface of the substrate, while the gas nozzle is moved from the central side of the substrate to the peripheral side thereof, with the gas nozzle being maintained to be positioned nearer to the central side of the substrate than the liquid nozzle, and
   in the fifth step, the process parameter to be changed includes at least one of a flow rate of the dry gas ejected from the gas nozzle, a moving speed of the liquid nozzle, a rotating speed of the substrate, and a distance between the gas nozzle and the surface of the substrate.

4. The substrate cleaning method according to claim 1, wherein
   the threshold value is a value set from a range between 5 mm and 15 mm.

5. The substrate cleaning method according to claim 1, wherein:
   in the third step, the cleaning liquid is ejected from the liquid nozzle to the surface of the substrate while the substrate is rotated and the liquid nozzle is moved from the central side of the substrate toward the peripheral side thereof, and an image including a boundary part between the intermediate area and the dry area is acquired; and
   the fourth step includes:
   a first sub-step in which an outer periphery of the intermediate area is specified based on a position of the liquid nozzle;
   a second sub-step in which an inner periphery of the intermediate area is specified based on a variation of brightness values of pixels constituting the image; and
   a third sub-step in which the width of the intermediate area is determined based on a linear distance between the outer periphery of the intermediate area, which has been specified in the first sub-step, and the inner periphery of the intermediate area, which has been specified in the second sub-step.

6. A computer-readable storage medium storing a program for causing a substrate cleaning apparatus to perform the substrate cleaning method according to claim 1.

* * * * *